United States Patent [19]

Newman

[11] Patent Number: 4,740,720

[45] Date of Patent: Apr. 26, 1988

[54] INTEGRATED INJECTION LOGIC OUTPUT CIRCUIT

[75] Inventor: Eric L. Newman, Eastleigh, England

[73] Assignee: International Business Machines Corporation, Armonk, N.Y.

[21] Appl. No.: 41,023

[22] Filed: Apr. 20, 1987

[30] Foreign Application Priority Data

May 22, 1986 [EP] European Pat. Off. ........ 86303885.7

[51] Int. Cl.[4] .................. H03K 19/091; H03K 19/092
[52] U.S. Cl. ................................ 307/459; 307/475; 307/477; 357/92
[58] Field of Search ............... 307/443, 459, 475, 477, 307/270; 330/257, 288; 357/92

[56] References Cited

U.S. PATENT DOCUMENTS

| | | | |
|---|---|---|---|
| 3,736,477 | 5/1973 | Berger | 317/235 |
| 3,956,641 | 5/1976 | Berger | 307/215 |
| 4,137,465 | 1/1979 | Hart | 357/92 X |
| 4,158,782 | 6/1979 | Price, Jr. | 357/92 X |
| 4,204,130 | 5/1980 | Harris | 307/477 X |
| 4,330,853 | 5/1982 | Heimeier | 365/227 |
| 4,348,600 | 9/1982 | Jarrett et al. | 357/92 X |
| 4,356,414 | 10/1982 | Güntner et al. | 307/475 X |
| 4,357,548 | 11/1982 | Preslar | 307/475 |
| 4,390,802 | 6/1983 | Woltz | 357/92 X |
| 4,439,695 | 3/1984 | Pelletier et al. | 307/459 X |
| 4,459,496 | 7/1984 | Yamada et al. | 307/477 X |

OTHER PUBLICATIONS

Kaneko et al, "Stacked I[2]L Circuit", *IEEE JSSC*, Apr. 1977, pp. 210–212.

*Primary Examiner*—Stanley D. Miller
*Assistant Examiner*—D. R. Hudspeth
*Attorney, Agent, or Firm*—Alexander Tognino

[57] ABSTRACT

An I[2]L output circuit is described for supplying current ($I_D'$) to an output node (8) of a plurality of I[2]L blocks (7) in order to ascertain the logic condition at the output node. The output circuit includes a standard I[2]L gate (11) with an input connection (12) to the semiconductor region comprising both the lateral injector transistor collector electrode and the vertical switching transistor base electrode, and an output connection (13) from the semiconductor region comprising one of the collectors electrodes of the switching transistor. The gate output being used to control two identical current sources ($T_{11}$, $T_{12}$) one of which ($T_{11}$) supplies current to the input of a simple current mirror ($T_{13}$, $T_{14}$) having its output connected to the gate input. The other current source ($T_{12}$) being connected to the output node of the logic blocks. The provision of a current feedback loop around the I[2]L gate in this way ensures that, upon stabilization, the current ($I_D'$) from the current source into the output node is very close in value to the internal injector current ($I_J$) of the I[2]L gate.

12 Claims, 2 Drawing Sheets

SECTION A—A

INTEGRATED INJECTION LOGIC OUTPUT CIRCUIT

FIELD OF THE INVENTION

The invention relates to conversion circuitry operable to supply interrogation current to an output node of a plurality of I²L blocks connected thereto to ascertain the logic condition of the blocks.

BACKGROUND OF THE INVENTION AND PRIOR ART

Integrated injection logic (I²L) circuits are now well established in the art and widely publicized in the technical literature. Attention is drawn for example to articles in the IEE Journal of Solid-State Circuits, Vol SC-7, No 5 Oct 1972, at page 340 and page 346. The I²L concept is essentially based on inverting single or multiple collector transistors which are powered by direct minority carrier injection close to their emitter-base junctions (order or magnitude, one diffusion length). This bipolar logic concept has very short switching times. In addition it is suitable for the manufacture of extremely highly integrated large-scale logical circuits.

Numerous patents and publications disclose I²L circuitry. Reference is made to the following U.S. Pat. Nos.: 3,736,477 entitled "Monolithic Semiconductor Circuit For A Logic Circuit Concept of High Packing Density" granted May 29, 1973 to H. H. Berger and S. K. Wiedmann; 3,956,641 entitled "Complementary Transistor Circuit for Carrying Out Boolean Functions" granted May 11, 1976 to H. H. Berger et al; and, 4,330,853 entitled "Method of and Circuit Arrangement For Reading And/Or Writing an Integrated Semiconductor Storage With Storage Cells in MTL (I²) Technology" granted May 18, 1982 to H. H. Heimeier et al FIGS. 1, 2 and 3 respectively disclose known circuitry and structure.

FIG. 1 shows a schematic diagram of a portion of a large scale integrated (LSI) circuit structure which contains an array of I²L cells 1, each bounded by isolation regions 2. A sectional view along line A-A is included as part of FIG. 1. The equivalent circuit of one of the cells is shown in FIG. 2. Briefly, layer 3 of highly doped N+ type material provides the substrate for the LSI structure. Each cell 1 is provided by a layer N1 of N− type material epitaxially grown in the N+ substrate 3. Regions P1 and P2 of P type material are diffused into the layer N1 and several, in this case four, regions N2.1, N2.2, N2.3 and N2.4 of N+ type material are diffused into the region P2. A diffusion of highly doped N+ type material through the body of the cell into the underlying substrate 3 provides the ladder-like isolation structure 2 effectively isolating one cell from its neighbors.

This cell structure provides a lateral semiconductor sequence P1/N1/P2 merged with a vertical semiconductor sequence N2/P2/N1. A silicon dioxide protection layer 4 overlays the surface of the LSI and is provided with apertures through which connections can be made to the two P type diffusions P1 and P2 and the four N type diffusions N2.1, N2.2, N2.3 and N2.4.

The equivalent circuit of the basic cell is shown in FIG. 2 with appropriate potentials applied so that it functions as an I²L four output gate. In this configuration, the lateral injector PNP transistor T1 supplies injector current $I_J$ to the four-collector vertical inverting NPN multiple transistor T2. The input to the gate is applied via input conductor 5 connected to the P2 region and the outputs taken from any or all of the four collector electrodes of the multiple transistor T2 via output conductors 6.1, 6.2, 6.3 and 6.4 connected respectively to the N2.1, N2.2, N2.3 and N2.4 regions.

In operation, an effective short circuit at the input conductor 5, for example from the low level output (0.1 volts) of a preceding gate, causes the injector current $I_J$ through injector transistor T1 to be diverted to ground. The multiple electrode inverting transistor T2 consequently remains OFF and the potential on the output conductors (assuming that they are connected to appropriate loads) remain high (0.7 volts if connected as input to a succeeding gate). An effective open circuit at the input terminal 5, for example from the high level output (0.7 volts) of a preceding gate, diverts the injector current $I_J$ through injector transistor T1 into the base region of the inverter transistor T2 causing it to conduct. Consequently, the potential on the output conductors drop to the low level (0.1 volts if the loads are provided by further identical gates).

This is the normal operation of I²L devices, with the output collectors being pulled from some voltage, generally the device Vbe, to ground, or vice-versa. Combinations of such gates are interconnected to provide logic functions at an output node in known manner. A difficulty with I²L circuits is that the inverting devices have a low breakdown voltage and thus cannot be used directly to drive other circuits which operate at comparatively higher voltages. There is a need therefore for an output circuit which is operable to supply the necessary current to an output node of an I²L circuit combination in order to generate an output signal indicative of the logic condition of the output node.

A typical circuit which converts internal (on chip) I²L signal levels to external signal levels such as VTL is shown included as part of the circuit in FIG. 3. In the figure a number of I²L logic blocks 7 are shown connected to an output node 8. In order to interrogate the logic condition of the I²L combination a current $I_D$ is required to be supplied to output node 8 being of a value close to that of the internal injection current $I_J$ of an I²L gate. Depending upon the logic state of the I²L combination, this current $I_D$ will either be diverted to ground, in which case output transistor T3 with its base connected to node 8 will remain or be turned OFF, or alternatively diverted into the base of transistor T3 in which case the transistor T3 will remain or be turned ON. The output transistor is a real on-chip transistor (i.e. not inverted) with a high beta and high collector/base, collector/emitter breakdown voltage. An output terminal 9 is connected to the collector of transistor T3 which may be operating from a relatively high supply voltage such as, in the case of VTL, 5 volts.

This prior art circuit incorporates an I²L gate 10 comprising injector transistor T4 and multicollector inverting transistor T5 arrangement as described previously with reference to FIG. 2. The gate 10 is not standard in that is has been modified by the provision of an additional connection shorting the base of the inverting transistor T5 to its collectors.

There is no input connection to the gate which as a result of the modification functions as a rudimentary current mirror and approximately mirrors the injector current $I_J$ supplied by injector transistor T4 into the collectors of the inverting transistor T5. This current is further mirrored by conventional current mirror combination of transistors T6, T7 and T8 to provide the interrogation current $I_D$ at node 8.

In practice, this circuit has several disadvantages which lead to a poorly defined current $I_D$. First the NPN transistors comprising the inverting combination in the I²L gate providing the mirror function have very poor matching characteristics. The I²L gate has a large base drive current to the merged NPN transistors which is NPN Beta inverse dependent. The PNP current mirror has collector voltages that are different and referenced to different power supplies. Thus the $V_{ce}$ for transistor T6 is $2V_{be}$'s whereas the $V_{ce}$ for transistor T8 is the supply $V-V_{be}$ where V is the supply voltage. As the collector slope resistance of PNP transistors in typical technologies is low and temperature dependent, this reduces the accuracy of definition of the current $I_D$. In practice with this circuit, the cumulative effect of these three disadvantages results in the value of $I_D$ being about 30% less than the value of the injector current $I_J$. Finally, referencing to different power supplies reduces noise immunity of the circuit which is an additional disadvantage.

SUMMARY OF THE INVENTION

A primary object of the invention is to provide improved I²L circuitry.

A further object of the invention is to provide a conversion circuit operable to supply interrogation current to an output node of a plurality of I²L blocks connected thereto in order to ascertain the logic condition of the blocks.

A still further object of the invention is to provide an output circuit for converting I²L signal levels to external signal levels for driving circuits operating at higher voltages, such as for example VTL circuits.

According to the invention, a conversion circuit operable to supply interrogation current to an output node of a plurality of I²L blocks connected thereto in order to ascertain the logic condition of the blocks, includes an I²L gate having an input terminal and an output terminal, the output terminal being applied as control input to two substantially identical current sources, the resulting current from one of said sources being applied as input to a current mirror, the output of which is connected to the input of the I²L gate, and the current from the other of said sources being supplied as said interrogation current to said output node.

The known prior art has been described hereinbefore with reference to FIGS. 1 to 3 of the accompanying drawings.

BRIEF DESCRIPTION OF THE DRAWINGS

These and other objects, features and advantages of the invention will be apparent from the following more particular description of the preferred embodiments of the invention as illustrated in the drawings.

DESCRIPTION OF THE PREFERRED EMBODIMENT

Figure 3:
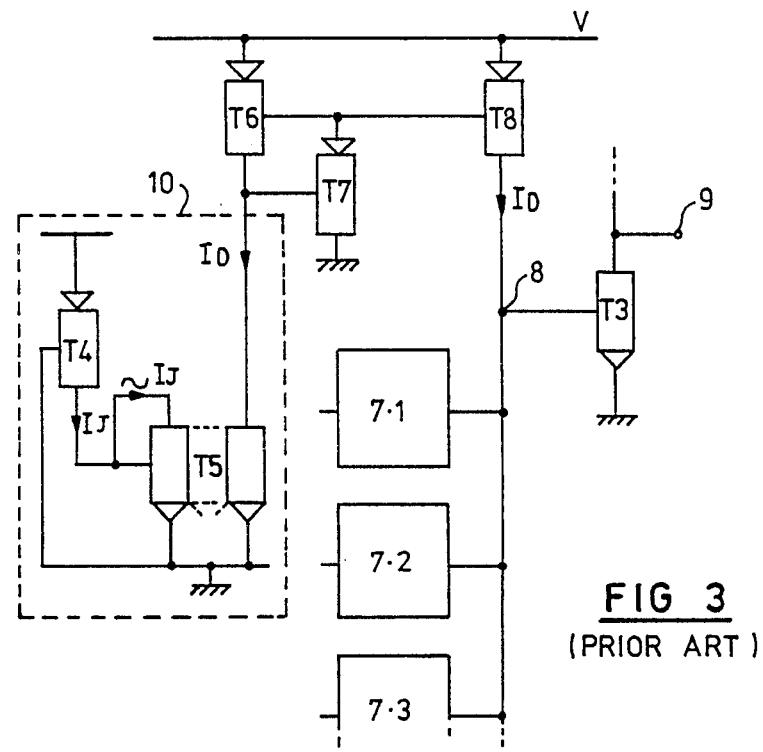
FIG. 3 shows a typical, or known, output circuit for converting internal I²L signal levels to external signal levels for driving circuits operating at higher voltages and currents such as for example VTL.

Having therefore described the prior art and its disadvantages, a preferred embodiment of the present invention will now be described with reference to FIG. 4 of the accompanying drawings. In this figure, an output converter circuit is required to supply as before an interrogation current to the output node 8 of logic combination 7. An output transistor $T_3$ is again shown connected to node 8 as in the prior art circuit described with reference to FIG. 3, operable to supply output signals to output terminal 9 representing the logic state of the logic combination 7. The requirement of the output converter circuit of the present invention is that it should supply an interrogation current $I_D'$ much closer in value to the internal injector current $I_J$ of an I²L gate than the corresponding interrogation current $I_D$ of the prior art circuit.

Figure 1:
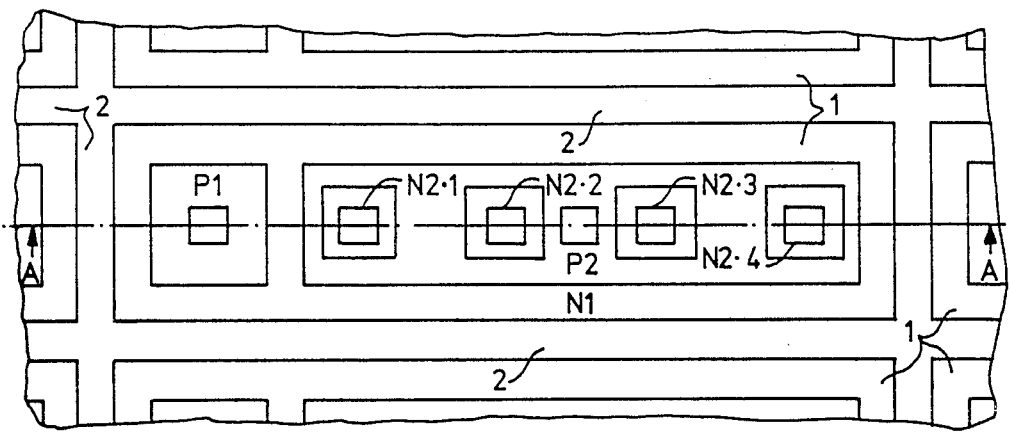
FIG. 1 shows schematically in plan view and in section a portion of a known LSI circuit structure containing an array of I²L cells.
Figure 2:
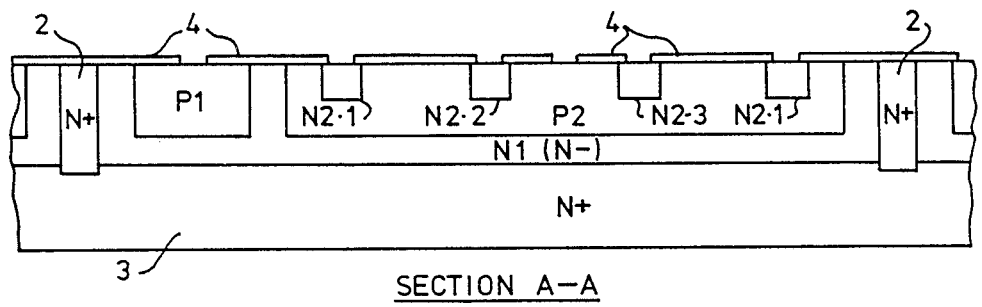
FIG. 2 shows the equivalent circuit of one of the known cells contained in FIG. 1.
Figure 2:
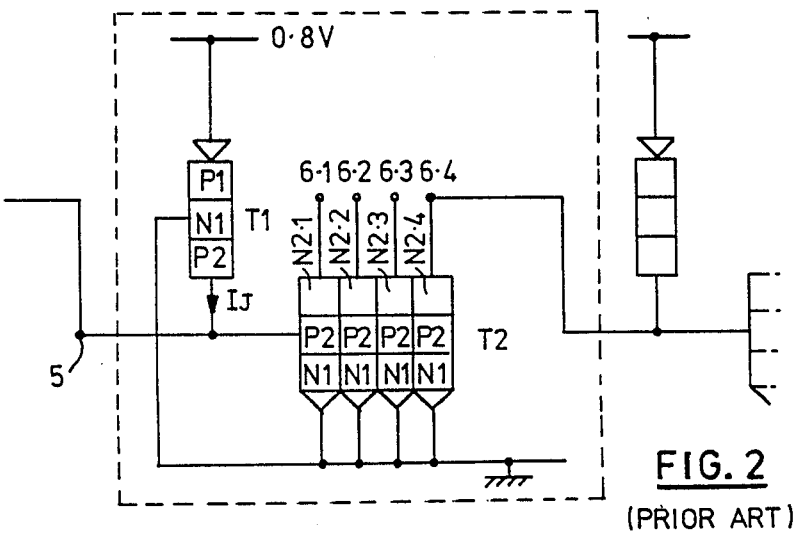
Figure 4:
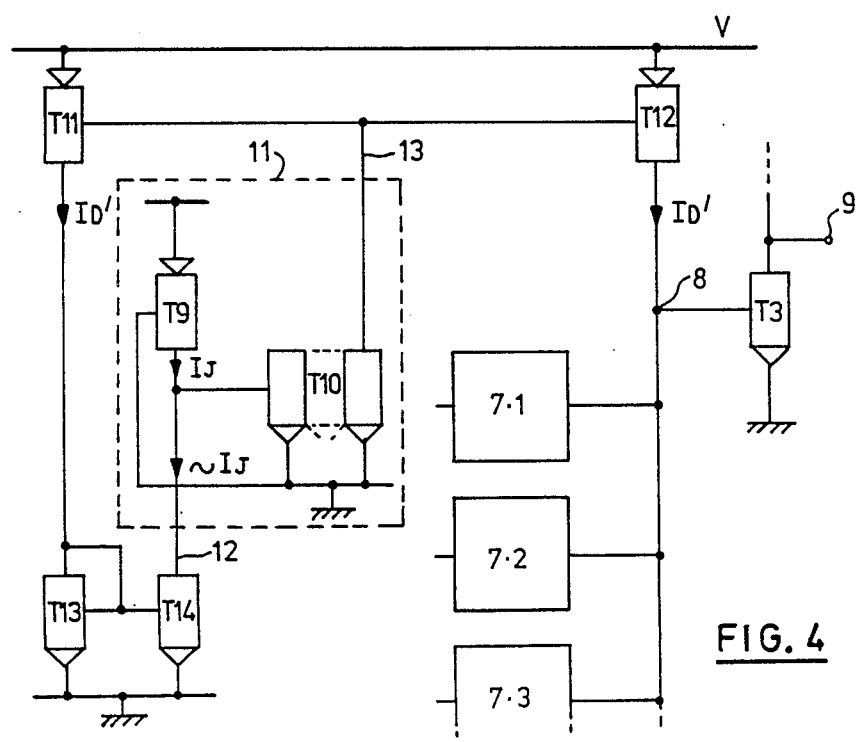
FIG. 4 shows an improved output circuit, in accordance with the invention, for converting internal I²L signal levels to external signal levels for driving circuits operating at higher voltages and currents such as for example VTL.

The converter circuit of FIG. 4 includes a conventional I²L gate 11 comprised of a lateral injector transistor $T_9$ and a multicollector vertical inverting transistor $T_{10}$ as previously described herein. The input to the gate 11 is via conductor 12 connected to the common injector collector and inverter base region (corresponding to region P2 in FIG. 2). The output is via conductor 13 connected to one of the collectors of multiple transistor $T_{10}$. It should be pointed out that a multi-conductor inverting transistor is not essential and that an I²L gate constructed so as to provide a single inverter transistor with only one collector output is all that is required. However since it is more likely that the available gates on an LSI layout will incorporate multi-collector devices it is felt that this structure is more representative of actuality. The output conductor 13 from the I²L gate is connected to the base electrodes of two identical, or substantially identical PNP transistors $T_{11}$ and $T_{12}$. The emitters of the two transistors are connected to a common supply rail V. The collector of transistor $T_{11}$ is connected as input to a conventional current mirror comprised of NPN transistors $T_{13}$ and $T_{14}$, the output of which is directly connected to the conductor 12, the input to the I²L gate 11. The collector of transistor $T_{12}$ is directly connected to the logic output node 8.

In order to understand the operation of this circuit it is helpful to consider the situation where all the devices are in the process of turning on. Thus with injector current $I_J$ from injector transistor $T_9$ increasing, inverter transistor $T_{10}$ starts to turn ON. The fall in voltage on the gate output 13 causes current supply PNP transistors $T_{11}$ and $T_{12}$ to turn on equally to develop the current $I_D'$ in their respective collectors. The collector current $I_D'$ from transistor $T_{11}$ into the mirror input turns on NPN transistors $T_{13}$ and $T_{14}$ equally. The turning on of mirror transistor $T_{14}$ as the effect of robbing the injector current $I_J$ from the base of inverter transistor $T_{10}$ of the I²L gate 11 by an amount equal to the input current $I_D'$ to the mirror. The feed back loop thus described stabilizes when substantially all the injector current is flowing into the mirror transistor $T_{14}$ and consequently with very little base current into inverting transistor $T_{10}$. Assuming a value for the beta of the PNP transistors $T_{11}$ and $T_{12}$ of 10 then the value of their combined base currents and the collector current of the inverter transistor is $2I_D'/10$. Assuming also a value for the beta of the NPN inverting transistor $T_{10}$ of 6 then the base current required to sustain the circuit is only $I_D'/30$. Accordingly at stability the value of the interrogation current $I_D'$ into the output node 8 is only about 3% less than the injector current $I_J$. This represents a substantial improvement in accuracy over the value of the corresponding interrogation current $I_D$ of the prior art circuit which is about 30% less than the injector current $I_J$. It should be noted that the collector voltages of the two current supply transistors $T_{11}$ and $T_{12}$ are to all intents and purposes identical. Thus the $V_{ce}$ of transistor $T_{11}$ is $V - V_{be}(T_{13})$ whereas the $V_{ce}$ of transistor $T_{12}$ is $V - V_{be}(T_3)$. The circuit can be improved by including emitter resistors for the PNP transistors $T_{11}$ and $T_{12}$ and by using Darlington outputs. Although the conversion circuit according to the present invention has one more active device, in practice it takes up only as much or even less space since it has one less PNP transistor which take up twice or three times the area as a NPN depending upon the technology employed. Finally, the injector current of the circuit in accordance with the invention can be changed by up to two decades as may be required for various applications without affecting its operation.

In summary therefore, the conversion circuit has the following advantageous features:

(1) the circuit tends to be independent of injector current value;
(2) the circuit provides more drive than the described prior art conversion circuit;
(3) the circuit is smaller than the prior art circuit; and
(4) the circuit requires about half the power supply voltage of the prior art circuit.

While the invention has been shown and described with reference to a preferred embodiment thereof it will be understood by those skilled in the art that various changes in form and details may be made therein without departing from the spirit and scope of the invention.

What is claimed is:

1. An $I^2L$ output circuit operable to supply interrogation current to an output node (8) of a plurality of $I^2L$ blocks (7) connected thereto in order to ascertain the logic condition of the blocks, said circuit including an $I^2L$ gate (11) having an input terminal (12) and an output terminal (13), the output terminal being connected as control input to two substantially identical current sources ($T_{11}$, $T_{12}$), the arrangement being such that, in operation, the resulting current ($I_D'$) from one of said sources ($T_{11}$) is applied as input to a current mirror ($T_{13}$, $T_{14}$), the output of which is connected to the input of the $I_2L$ gate and the current from the other of said sources ($T_{12}$) is supplied as said interrogation current ($I_D'$) to said output node.

2. An $I^2L$ output circuit as claimed in claim 1, in which said output node is further connected to the control input of an output device ($T_3$) operable in response to application of said interrogation current to said output node to generate at its output (9) a signal, indicative by its level of the prevailing logic condition at said output node.

3. An $I^2L$ output circuit as claimed in claim 2, in which said two current sources comprise first and second PNP transistors, the emitter electrodes of which are connected to a common supply voltage, the base connections of which are directly connected together and to said Output terminal of said $I^2L$ gate and in which the collector of the first PNP transistor is connected to the input to the current mirror and the collector of the second PNP transistor is connected to the output node.

4. An $I^2L$ output circuit as claimed in claim 3, in which the current mirror comprises first and second NPN transistors connected in common emitter mode to a reference potential, the first transistor having its collector electrode shorted to its base electrode and to the base electrode of the second transistor, the collector of said first PNP transistor being connected to the collector of said first NPN transistor and the collector of the second NPN transistor being connected to the input terminal of said $I^2L$ gate.

5. An $I^2L$ circuit as claimed in claim 4, in which the emitter electrodes of the first and second PNP transistors are directly connected to the common supply voltage and the emitter electrodes of the first and second NPN transistors are directly connected to the reference potential.

6. An $I^2L$ output circuit as claimed in claim 1, in which said two current sources comprise first and second PNP transistors, the emitter electrodes of which are connected to a common supply voltage, the base connections of which are directly connected together and to said Output terminal of said $I^2L$ gate and in which the collector of the first PNP transistor is connected to the input to the current mirror and the collector of the second PNP transistor is connected to the output node.

7. An $I^2L$ output circuit as claimed in claim 6, in which the current mirror comprises first and second NPN transistors connected in common emitter mode to a reference potential, the first transistor having its collector electrode shorted to its base electrode and to the base electrode of the second transistor, the collector of said first PNP transistor being connected to the collector of said first NPN transistor and the collector of the second NPN transistor being connected to the input terminal of said $I^2L$ gate.

8. An $I^2L$ circuit as claimed in claim 7, in which the emitter electrodes of the first and second PNP transistors are directly connected to the common supply voltage and the emitter electrodes of the first and second NPN transistors are directly connected to the reference potential.

9. An $I^2L$ circuit output operable to supply interrogation current to an output node of a plurality of $I^2L$ blocks connected thereto, the output node being further connected to an output device operable to generate an output signal indicative of the logic condition at the output node in response to interrogation current supplied thereto, said circuit including an $I^2L$ gate comprising merged complementary transistors providing an PNP lateral injector transistor and an NPN vertical switching transistor having one or more collectors, an injector terminal connected to the emitter of the injector transistor, a voltage reference terminal connected to the common base of the injector transistor and emitter of the switching transistor, an input terminal connected to the common collector of the injector transistor and base of the switching transistor and one or more output terminals connected respectively to said one or more collectors of the switching transistor characterized in that at least one output terminal from said $I^2L$ gate is connected to drive the base of a PNP transistor, the collector of said PNP transistor, being connected to the input of a current mirror circuit, the output of the current mirror circuit being connected to the input terminal of the $I^2L$ gate, and a further PNP transistor with base and emitter connected to the base and emitter of said pnp transistor such that the collector currents from said PNP transistor and said further PNP transistor match and the collector of said further PNP transistor connected to the output node.

10. An output circuit for converting $I^2$ signal levels to external signal levels for driving circuits operating at higher voltages, such as for example VTL, said output circuit comprising:

first and second PNP transistors, said first and second PNP transistors each having an emitter, base and collector, said emitter of said first PNP transistor and said emitter of said second PNP transistor connected in common to a first source of potential;

first and second NPN transistors, said first and second NPN transistors each having an emitter, base and collector, said collector of said first NPN transistor said base of said first NPN transistor and said base of said second NPN transistor connected in common to said collector of said first PNP transistor, said emitter of said first NPN transistor and said emitter of said second NPN transistor connected in common to a reference source of potential.

an $I^2L$ logic circuit having an input and an output, said input of said $I^2L$ circuit connected to said collector of said second NPN transistor and said output of said logic circuit connected in common to said bases of said first and second PNP transistors; and, an output terminal of said output circuit, said output terminal, connected to said collector of said second PNP transistor.

11. An output circuit for converting $I^2$ signal levels to external signal levels for driving circuits operating at higher voltages, as recited in claim 10, wherein an output node of a plurality of $I^2L$ logic circuits is connected to said output terminal of said Output circuit.

12. An output circuit for converting $I^2$ signal levels to external signal levels for driving circuits operating at higher voltages, as recited in claim 11, wherein said $I^2L$ logic circuit having an input and an output comprises:

a PNP transistor having an emitter, base and collector, said collector of said PNP transistor functioning as the input of said $I^2L$ logic circuit, said emitter of said PNP transistor connected to a second source of potential; and at least one NPN transistor, said at least one NPN transistor having an emitter, base and collector, said base of said at least one NPN transistor connected to said collector of said PNP transistor, said emitter of said at least one NPN transistor and said base of said PNP transistor connected in common to said reference source of potential, and said collector of said at least one NPN transistor providing the output of said $I^2L$ logic circuit.

* * * * *